United States Patent
Kosakai (10) Patent No.: US 6,603,651 B2
(45) Date of Patent: Aug. 5, 2003

(54) ELECTROSTATIC CHUCK

(75) Inventor: Mamoru Kosakai, Funabashi (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 219 days.

(21) Appl. No.: 09/872,355

(22) Filed: May 31, 2001

(65) Prior Publication Data

US 2002/0044404 A1 Apr. 18, 2002

(30) Foreign Application Priority Data

Jun. 7, 2000 (JP) .................................. P2000-171028

(51) Int. Cl.⁷ .............................................. H01F 13/02
(52) U.S. Cl. ...................................................... 361/234
(58) Field of Search .............................. 361/230, 233, 361/234; 279/128

(56) References Cited

U.S. PATENT DOCUMENTS

| | | | |
|---|---|---|---|
| 4,554,611 A | * 11/1985 | Lewin ........................ | 361/234 |
| 4,665,463 A | * 5/1987 | Ward et al. ................. | 361/234 |
| 5,560,780 A | * 10/1996 | Wu et al. .................... | 118/728 |
| 5,698,070 A | * 12/1997 | Hirano et al. ............... | 438/729 |
| 6,136,709 A | * 10/2000 | Schmidbauer et al. ...... | 438/688 |
| 6,256,186 B1 | * 7/2001 | Powell et al. ............... | 361/234 |

FOREIGN PATENT DOCUMENTS

| | | | |
|---|---|---|---|
| JP | 09-283606 | 10/1997 | ........... H01L/21/68 |
| JP | 09-283607 | 10/1997 | ........... H01L/21/68 |

* cited by examiner

*Primary Examiner*—Adolf D. Berhane
(74) *Attorney, Agent, or Firm*—Sierra Patent Group, Ltd.

(57) ABSTRACT

The present invention provides an electrostatic chuck that is able to completely prevent abnormal discharge that not only causes damage and destruction of the electrostatic chuck, but also causes damage of the fixed substrate as well as the generation of particles. In the electrostatic chuck of the present invention, at least a first insulating member, on the side on which a fixed substrate is placed among a first insulating member and second insulating member disposed in mutual opposition between which an electrode is interposed, is composed of a compound sintered body having for its main components 4% by weight to 12% by weight silicon carbide particles and aluminum oxide particles, and the first insulating member has varistor characteristics such that the volumetric specific resistance value of the first insulating member is from $1 \times 10^9$ to $1 \times 10^{12}$ $\Omega \cdot$ cm when the potential difference between the surface of the first insulating member on which the fixed substrate is placed and the electrode is 1000 V or less, and from $1 \times 10^7$ to $1 \times 10^8$ $\Omega \cdot$ cm when the potential difference between the surface of the first insulating member on the side on which the fixed substrate is placed and the electrode is 3000 V or more.

9 Claims, 4 Drawing Sheets

ELECTROSTATIC CHUCK

BACKGROUND OF THE INVENTION

1. Field of the Invention

The present invention relates to an electrostatic chuck capable of clamping fixed substrates such as semiconductor wafers, metal wafers or glass substrates used in the production of semiconductor devices and liquid crystal devices, etc. using electrostatic force.

2. Background Technology

In the past, examples of apparatuses for clamping substrates such as semiconductor wafers, metal wafers or glass substrates used in the production of semiconductor devices and liquid crystal devices, etc. (to be referred to as "fixed substrates") included a vacuum chuck capable of clamping fixed substrates by physically clamping the substrates using vacuum force, and a clamp capable of mechanically clamping fixed substrates.

However, in the case of using a vacuum chuck to clamp fixed substrates, due to difference in pressure between the external atmosphere and vacuum chuck under vacuum conditions, there was the problem of being unable to clamp the fixed substrates. In addition, in the case of mechanically clamping fixed substrates using a clamp, there were problems such as the locations on the fixed substrates where the clamp makes contact being unable to be used as a device, the occurrence of partial distortion in the fixed substrates, and the generation of particles caused by raising and lowering of the clamp.

Therefore, in order to solve the above problems, an electrostatic chuck is proposed that is capable of clamping fixed substrates using electrostatic force. An electrostatic chuck is mainly composed of a planar electrode and a pair of insulating members disposed in mutual opposition between which the electrode is interposed. As a result of placing a fixed substrate on one of the pair of insulating members and applying a prescribed voltage to the electrode, the fixed substrate can be clamped using electrostatic force.

In the past, compound sintered bodies, in which ceramics comprised of one type selected from titanium oxide, titanium nitride and silicon carbide were contained in ceramics such as aluminum oxide, or aluminum nitride-based sintered bodies and so forth, were proposed for the insulating members that compose such an electrostatic chuck.

However, in the case of using the above electrostatic chuck installed in an apparatus that uses plasma such as a plasma CVD apparatus, plasma etching apparatus, sputtering apparatus or ion injection apparatus, an electrical charge accumulates on the fixed substrate due to long-term plasma irradiation, and this accumulated electrical charge can cause an abnormal discharge. As a result, the electrostatic chuck may be damaged or destroyed, the fixed substrate may be damaged, or particles may be generated that have a detrimental effect on product performance.

Therefore, measures were employed in the prior art in order to prevent this abnormal discharge, examples of which include installing a ground wire on the surface of the fixed substrate to allow the electrical charge to escape, installing an electrically conductive ring around the outside of the fixed substrate to allow the electrical charge to escape, or installing an ionizer on the fixed substrate to allow the electrical charge to escape.

However, in the case of employing these measures, since it was necessary to install a ground wire, electrically conductive ring or ionizer and so forth on the fixed substrate, there was the problem of increased production costs of the electrostatic chuck.

In addition, in the case of employing the above measures, although the occurrence of abnormal discharge can be reduced, since abnormal discharge cannot be completely prevented, there was the problem of being unable to adequately prevent damage and destruction of the electrostatic chuck, damage of the fixed substrate, and the generation of particles.

SUMMARY OF THE INVENTION

The present invention was conceived to solve the above problems, and its object is to provide an electrostatic chuck that is able to completely prevent abnormal discharge that not only causes damage and destruction of the electrostatic chuck, but also causes damage of the fixed substrate as well as the generation of particles, without increasing the production cost of the electrostatic chuck.

As a result of conducting various studies to develop an electrostatic chuck having superior heat resistance and thermal shock resistance, which in addition to being able to completely prevent abnormal discharge, has at least an insulating member on the side on which the fixed substrate is placed that has low temperature dependency of electric conductivity, superior corrosion resistance to halogen gas and plasma, high strength and high hardness, the inventor of the present invention found that at least the insulating member on the side on which the fixed substrate is placed should be composed with a specific compound sintered body having for its main components silicon carbide particles and aluminum particles, thereby leading to invention of the electrostatic chuck of the present invention.

The electrostatic chuck of the present invention is an electrostatic chuck provided with a pair of insulating members disposed in mutual opposition between which an electrode is interposed, wherein a first insulating member of the above pair of insulating members at least on the side on which the fixed substrate is placed is composed of a compound sintered body having for its main components 4% by weight to 12% by weight of silicon carbide particles and aluminum particles, and the first insulating member has varistor characteristics.

The above varistor characteristics are such that the volumetric specific resistance value of the above first insulating member is from $1 \times 10^9$ to $1 \times 10^{12}$ $\Omega \cdot$ cm when the potential difference between the surface of the above first insulating member on which the fixed substrate is placed and the above electrode is 1000 V or less, and from $1 \times 10^7$ to $1 \times 10^8$ $\Omega \cdot$ cm when the potential difference between the surface of the above first insulating member on the side on which the fixed substrate is placed and the above electrode is 3000 V or more.

Furthermore, in the present invention, having for its main components silicon carbide particles and aluminum particles is defined as meaning that the content of silicon carbide particles and aluminum particles combined is 98% by weight or more.

The inventor of the present invention also found that by controlling the content of silicon carbide particles in the compound sintered body that composes the first insulating member on the side on which the fixed substrate is placed, the volumetric specific resistance of the first insulating member can be controlled. They also found that by making the content of silicon carbide particles in the above compound sintered body from 4% by weight to 12% by weight, the volumetric specific resistance value of the first insulating member could be made to be from $1\times10^9$ to $1\times10^{12}$ Ω·cm when the potential difference between the surface of the first insulating member on which the fixed substrate is placed and the electrode is 1000 V or less, and from $1\times10^7$ to $1\times10^8$ Ω·cm when the potential difference between the surface of the first insulating member on the side on which the fixed substrate is placed and the above electrode is 3000 V or more.

Namely, it was found that the first insulating member is provided with varistor characteristics by composing the first insulating member on the side on which the fixed substrate is placed in the manner described above, and since electrical charge accumulated on the fixed substrate can be easily discharged by providing a connecting wire and so forth to the first insulating member even in cases in which plasma is irradiated onto the electrostatic chuck for a long period of time, there is no accumulation of electrical charge on the fixed substrate, thereby making it possible to completely prevent abnormal discharge.

In addition, in the case of using the electrostatic chuck of the present invention, since electrical charge that accumulates on the fixed substrate can be easily discharged by providing a connecting wire and so forth on the first insulating member, it is not necessary to install a ground wire, electrically conductive ring or ionizer and so forth on the fixed substrate as in the prior art, thereby making it possible to reduce the production cost of the electrostatic chuck.

In addition, the inventor of the present invention found that by making the content of silicon carbide particles in the compound sintered body that composes the first insulating member from 4% by weight to 12% by weight, the hardness and strength of the first insulating member are remarkably improved, thereby reducing the generation of particles.

Moreover, the inventor of the present invention found that a first insulating member having the above composition has low temperature dependency of its electrical conductivity, superior corrosion resistance to halogen gas, superior heat resistance and thermal shock resistance, and is free of risk of damage due to thermal stress even during use at high temperatures.

In addition, the inventor of the present invention found that, in the case the average particle size of the silicon carbide particles contained in the compound sintered body that composes the first insulating member exceeds 0.5 µm, the effect of improving the strength of the first insulating member due to addition of silicon carbide particles is diminished, resulting in the risk of an electrical field during plasma irradiation concentrating in the portion of silicon carbide particles and causing the area around the silicon carbide particles to be susceptible to damage.

Thus, it is preferable that the average particle size of the silicon carbide particles contained in the compound sintered body that composes at least the first insulating member of the pair of insulating members of the electrostatic chuck of the present invention be 0.5 µm or less, and preferably 0.2 µm or less.

In addition, the inventor of the present invention found that, in the case the average particle size of the aluminum oxide particles contained in the compound sintered body that composes the first insulating member exceeds 2 µm, the first insulating member is easily etched by plasma resulting in the formation of sputtering scars on the surface of the first insulating member on the side on which the fixed substrate is placed, increased surface roughness and reduced electrostatic adsorption force of the electrostatic chuck.

Thus, it is preferable that the average particle size of the aluminum oxide particles contained in the compound sintered body that composes at least the first insulating member of the pair of insulating members of the electrostatic chuck of the present invention be 2 µm or less.

In addition, the inventor of the present invention found that, in the case at least a portion of the silicon carbide particles are present within the aluminum oxide particles in the compound sintered body that composes the first insulating member, together with the plasma resistance of the first insulating member being improved, due to the gap between the silicon carbide particles becoming narrower, varistor effects can be demonstrated by adding only a small amount of silicon carbide particles.

Thus, it is preferable that at least a portion of the silicon carbide particles be formed within the aluminum oxide particles in the compound sintered body that composes at least the first insulating member of the pair of insulating members of the electrostatic chuck of the present invention.

Furthermore, a small amount of impurities are permitted in the compound sintered body that composes the first insulating member. However, in the case the fixed substrate is used in the production of semiconductor devices, the decreases in life time and gate voltage in the semiconductor device production process are caused by transition metal elements and alkaline metals. In addition, it was verified through research conducted by the inventor of the present invention that, if the amount of metal impurities other than aluminum or silicon exceeds 0.1% by weight, together with the potential for contaminating the wafer or other fixed substrate increasing, the temperature dependency of the electrical resistance of the first insulating member also becomes larger, thereby making this undesirable.

Thus, the content of metal impurities other than aluminum and silicon in the compound sintered body that composes at least the first insulating member of the pair of insulating members of the electrostatic chuck of the present invention is preferably 0.1% by weight or less.

Furthermore, although the second insulating member of the pair of insulating members in the present invention on the side on which the fixed substrate is not placed may be composed of an insulating member having a structure that differs from that of the first insulating member, it is preferable that the second insulating member also be composed of a compound sintered body having the same structure as the first insulating member.

By giving the second insulating member the same structure as the first insulating member, in addition to enabling the second insulating member to have superior corrosion resistance to halogen gas and plasma, high strength and hardness and superior heat resistance and thermal shock resistance, the production process of the electrostatic chuck can be simplified.

According to the present invention, since at least a first insulating member on the side on which a fixed substrate is placed is composed with a compound sintered body of a specific composition having satisfactory varistor characteristics, together with the occurrence of abnormal discharge in the plasma atmosphere, which causes damage and destruction of the electrostatic chuck, damage of the fixed substrate and the generation of particles, being able to be completely prevented, at least the first insulating member on the side on which the fixed substrate is placed has little temperature dependency of its electrical conductivity, superior corrosion resistance to halogen gas and plasma, high strength and hardness, and superior heat resistance and thermal shock resistance, and an electrostatic chuck can be provided that has superior response of adsorption and release of the fixed substrate.

In addition, in the case of using the electrostatic chuck of the present invention, since electrical charge that has accumulated on the fixed substrate can be easily discharged by providing a connecting wire and so forth on the first insulating member, it is no longer necessary to install a ground wire, electrically conductive ring or ionizer and so forth on the fixed substrate as in the prior art, thereby making it possible to reduce the production cost of the electrostatic chuck.

EXPLANATION OF THE PREFERRED EMBODIMENTS

The following provides a detailed explanation of one mode for carrying out the present invention as claimed in the present invention.

Figure 1:
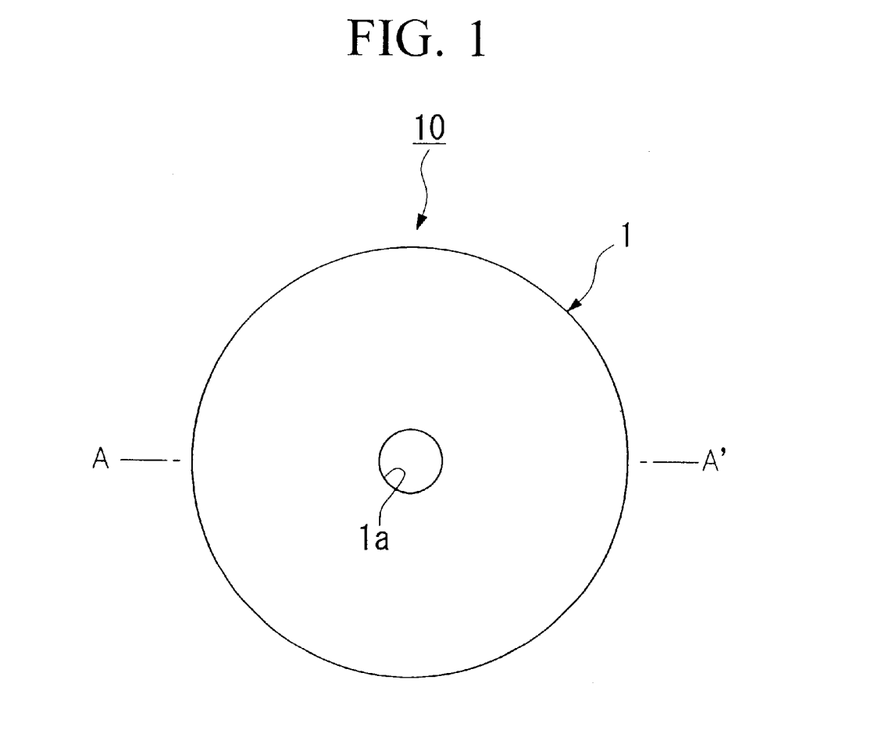
FIG. 1 is a schematic overhead view showing an electrostatic chuck of one mode for carrying out the present invention as claimed in the present invention as viewed from the surface on the side on which the fixed substrate is placed.
Figure 2:
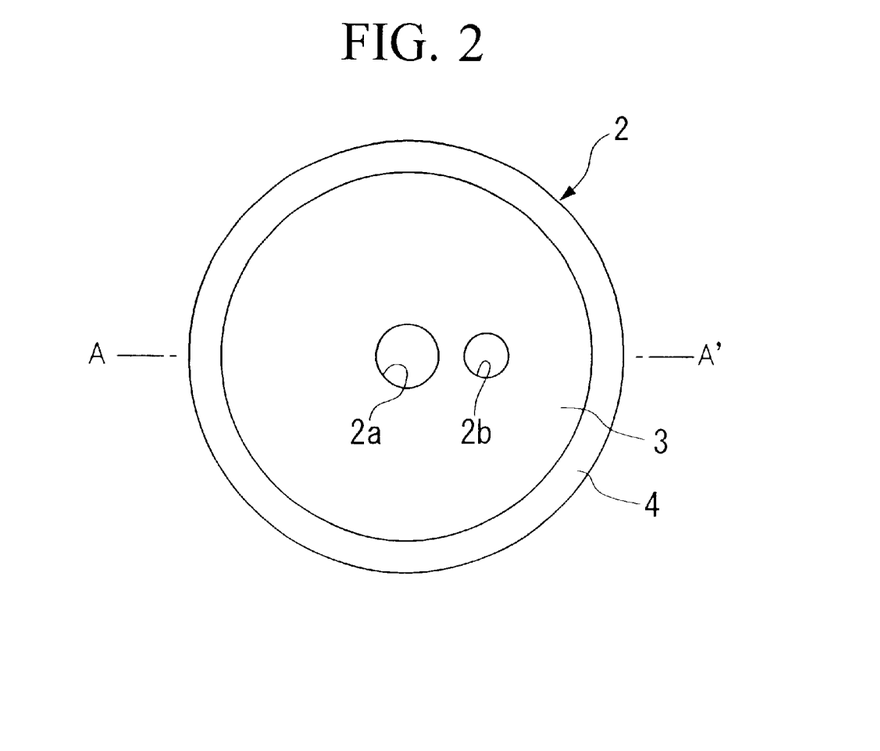
FIG. 2 is a schematic overhead view showing the structure of the electrode and second insulating member of an electrostatic chuck of one mode for carrying out the present invention as claimed in the present invention.
Figure 3:
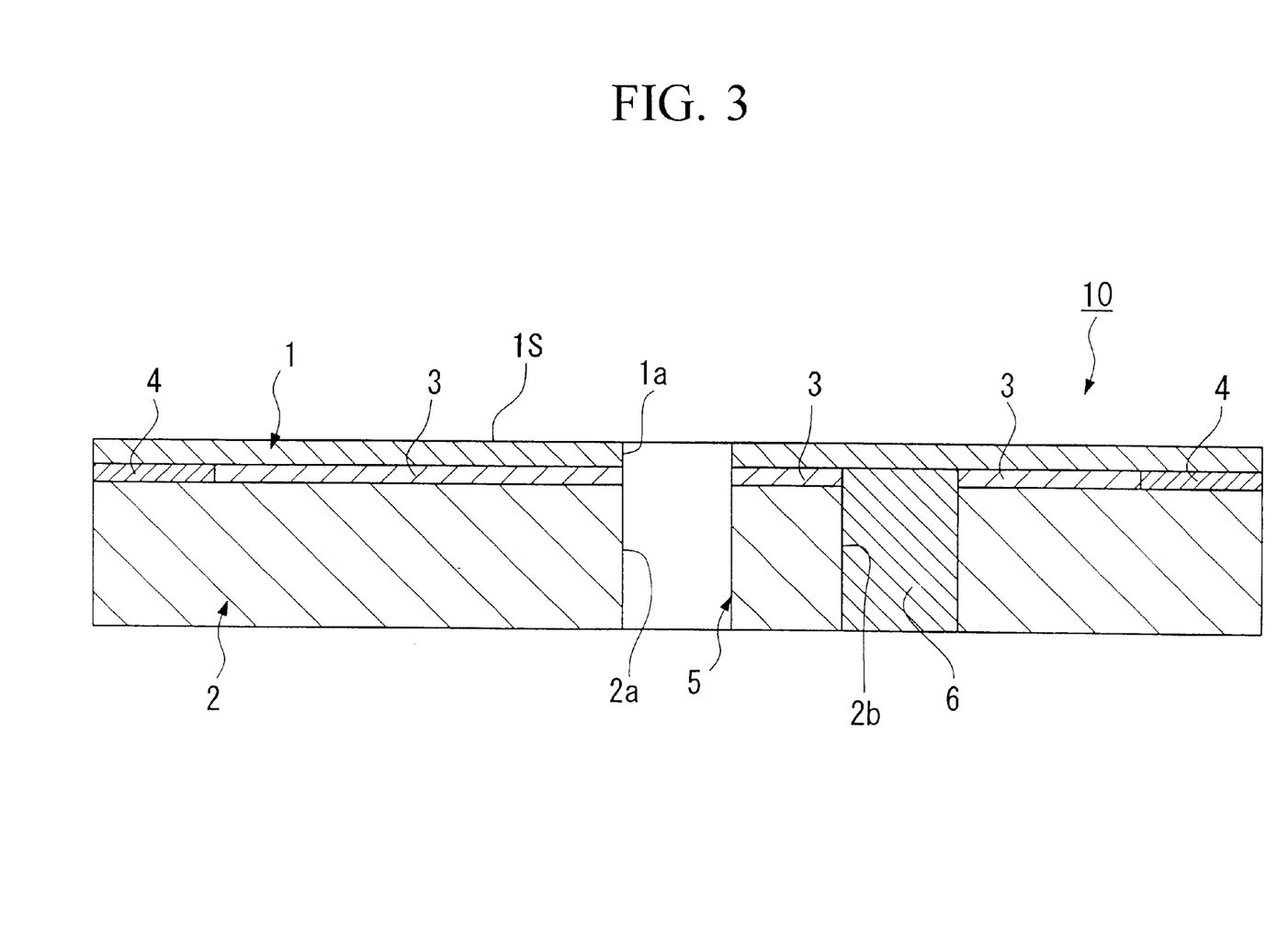
FIG. 3 is a schematic cross-sectional view showing the structure of an electrostatic chuck of one mode for carrying out the present invention as claimed in the present invention.

An explanation is provided of the structure of electrostatic chuck 10 of a mode for carrying out the present invention as claimed in the present invention based on FIGS. 1 through 3. Furthermore, the electrostatic chuck described below is only one example of such, and the present invention is not limited to the electrostatic chuck described below.

FIG. 1 is a schematic overhead view of electrostatic chuck 10 when viewed from the surface on the side on which the fixed substrate is placed. FIG. 2 is a schematic overhead view of an electrode and second insulating member of electrostatic chuck 10 to be described later when viewed from the electrode side. FIG. 3 is a schematic cross-sectional view of electrostatic chuck 10. Furthermore, FIG. 3 is the cross-sectional view when electrostatic chuck is cut along line A–A' shown in FIGS. 1 and 2.

In the present mode for carrying out the invention, an explanation is provided for an electrostatic chuck 10 comprised of a disk shape as shown in FIGS. 1 and 2.

As shown in FIG. 3, electrostatic chuck 10 is mainly composed of a first insulating member 1 for placing a fixed substrate such as a semiconductor wafer, metal wafer or glass substrate, a second insulating member 2 disposed in opposition to the first insulating member 1, and a planar electrode 3 interposed between the first insulating member 1 and second insulating member 2. In FIG. 3, the surface corresponding to the upper side of the first insulating member 1 in the drawing is surface 1S on the side on which the fixed substrate is placed.

Electrostatic chuck 10 employs a structure that allows it to clamp a fixed substrate using electrostatic force by placing a fixed substrate on the first insulating member 1 and applying a prescribed voltage to electrode 3.

As shown in FIGS. 2 and 3, the first insulating member 1 and second insulating member 2 are tightly joined by means of electrode 3 and insulating joining layer 4 provided between the first insulating member 1 and second insulating layer 2 and in the area to the outside of electrode 3.

In addition, as shown in FIG. 3, through hole 5 for inserting a pressing member (not shown) that pushes on the fixed substrate from below in the drawing is provided through first insulating member 1 and second insulating member 2 for releasing a fixed substrate that is electrostatically adsorbed in electrostatic chuck 10.

Furthermore, in this through hole 5, the through hole formed inside first insulating member 1 is designated as through hole 1a, while the through hole formed inside second insulating member 2 is designated as through hole 2a.

In addition, as shown in FIGS. 2 and 3, electrode insertion hole 2b that passes through second insulating member 2 is provided in the area in which electrode 3 is formed in second insulating member 2, and takeoff electrode 6 for applying a voltage to electrode 3 is installed in electrode insertion hole 2b. The upper end in the drawing of takeoff electrode 6 is electrically joined with electrode 3.

In addition, a means for discharging the electrical charge of the fixed substrate, such as a connecting wire (not shown), is preferably connected to the first insulating member 1.

The following provides a detailed explanation of the structure of the above first insulating member 1.

In the present mode for carrying out the invention, first insulating member 1 is composed of a compound sintered body having for its main components 4 to 12% by weight of silicon carbide particles and aluminum oxide particles.

Furthermore, in the present mode for carrying out the invention, having for its main components silicon carbide particles and aluminum particles is defined as meaning that the content of silicon carbide particles and aluminum particles combined is 98% by weight or more.

In addition, the volumetric specific resistance of the first insulating member is from $1 \times 10^9$ to $1 \times 10^{12}$ $\Omega \cdot$ cm when the potential difference between the surface S1 of the first insulating member 1 on which the fixed substrate is placed and electrode 3 is 1000 V or less, and from $1 \times 10^7$ to $1 \times 10^8$ $\Omega \cdot$ cm when the potential difference between surface S1 of the first insulating member 1 on the side on which the fixed substrate is placed and electrode 3 is 3000 V or more, and first insulating member 1 has varistor characteristics.

In addition, in the present mode for carrying out the invention, the average particle size of the silicon carbide particles contained in the compound sintered body that composes the first insulating member 1 is preferably 0.5 $\mu$m or less, and more preferably 0.2 $\mu$m or less. In addition, the average particle size of the aluminum oxide particles contained in the compound sintered body that composes the first insulating member 1 is preferably 2 $\mu$m or less.

Moreover, at least a portion of the silicon carbide particles in the compound sintered body that composes the first insulating member 1 is preferably present within the aluminum oxide particles.

In addition, the content of metal impurities other than aluminum and silicon in the compound sintered body that composes the first insulating member 1 is preferably 0.1% by weight or less.

The first insulating member 1 having the structure described above has satisfactory varistor characteristics, low temperature dependency of its electrical conductivity, superior corrosion resistance to halogen gas and plasma, high strength and hardness, and superior heat resistance and thermal shock resistance.

Furthermore, in the present mode for carrying out the invention, although the second insulating member 2 may be composed of an insulating member having a different structure than the first insulating member 1, it is preferable that the second insulating member 2 also be composed from a compound sintered body having the same structure as first insulating member 1.

As a result of second insulating member 2 having the same structure as first insulating member 1, in addition to it being able to have superior corrosion resistance to halogen gas and plasma, high strength and hardness and superior heat resistance and thermal shock resistance, the production process of electrostatic chuck 10 can be simplified.

Next, a detailed explanation is provided of the production method of the above electrostatic chuck 10 using the example of the second insulating member 2 being composed of a compound sintered body having the same structure as first insulating member 1.

To begin with, an explanation is provided of the production method of first insulating member 1 and second insulating member 2.

When producing first insulating member 1 and second insulating member 2, the use of a raw material powder having an average particle size of 0.1 $\mu$m or less for the raw material powder of the silicon carbide particles is advantageous for the reasons indicated below.

In the case of being formed using silicon carbide raw material powder having an average particle size in excess of 0.1 $\mu$m, since the average particle size of the silicon carbide particles in the sintered body exceeds 0.5 $\mu$m, the effect of improving the strength of first insulating member 1 and second insulating member 2 by addition of silicon carbide particles is diminished.

In addition, when a first insulating member 1 composed of a compound sintered body formed using silicon carbide raw material powder having an average particle size in excess of 0.1 $\mu$m is exposed to plasma, the electric field concentrates in the portion of the silicon carbide particles resulting in susceptibility to considerable damage. Thus, there is the risk of a decrease in electrostatic adsorption force following plasma damage.

In addition, in the case of using silicon carbide raw material powder having an average particle size in excess of 0.1 $\mu$m, it is necessary to increase the amount of silicon carbide added due to its low plasma resistance in order to obtain a compound sintered body having varistor characteristics.

Furthermore, powder formed by plasma CVD is preferable for the silicon carbide raw material powder used as the raw material of first insulating member 1. Ultra-fine powder having an average particle size of 0.1 $\mu$m or less, which is formed by introducing a raw material gas of a silane compound or silicon halide and hydrocarbon into plasma in a non-oxidizing atmosphere followed by reacting the liquid phase while controlling the pressure of the reaction system within the range of less than 1 atmosphere to 1.33×10 Pa (0.1 Torr), is particularly preferable because of its superior sinterability, high purity and satisfactory dispersivity during forming due to the spherical shape of the particles.

On the other hand, when producing first insulating member 1 and second insulating member 2, it is preferable to use a raw material powder having an average particle size of 0.5 $\mu$m or less as the raw material powder of the aluminum oxide particles for the reasons indicated below.

In a compound sintered body formed using an aluminum oxide raw material powder having an average particle size in excess of 0.5 $\mu$m, since the average particle size of the aluminum oxide particles in the compound sintered body exceeds 2 $\mu$m, first insulating member 1 is easily etched by plasma, sputtering scars are formed on surface 1S of first insulating member 1 on the side on which the fixed substrate is placed, and surface roughness increases, thereby resulting in the risk of a decrease in the electrostatic adsorption force of electrostatic chuck 10.

Furthermore, there are no particular limitations on the aluminum oxide raw material powder used as the raw material of first insulating member 1 and second insulating member 2 provided it has an average particle size of 0.5 $\mu$m or less, and should be of high purity.

The above silicon carbide raw material powder and the above aluminum oxide raw material powder are mixed at a ratio of 4 to 12% by weight of silicon carbide to 96 to 88% by weight of aluminum oxide. When mixing, it is preferable to use an ultra-high pressure crushing and dispersion method. At this time, although the presence of a small amount of dispersant and other impurities is allowed, it is preferable to mix the silicon carbide raw material powder and aluminum oxide raw material powder such that the content of metal impurities other than aluminum and silicon is 0.1% by weight or less.

An "ultra-high pressure crushing and dispersion method" refers to a method in which particles accelerated with high pressure collide resulting in crushing and dispersion, and when this mixing method is used, uniform dispersion is easy by only adding a small amount of dispersant. There is also no formation of coarse particles and contamination by impurities such as carbon attributable to the dispersant and various metal impurities can be reduced.

Next, this mixed powder is molded in accordance with known methods to mold a disk-shaped compact. Continuing, the resulting compact is degreased. Degreasing is preferably carried out in an argon atmosphere at 600° C. or below, or in an air atmosphere at 300° C. or below. By carrying out degreasing under these conditions, in addition to oxidation of the silicon carbide being able to be prevented, degreasing can be carried out efficiently.

Next, the compact on which degreasing has been completed is sintered while applying pressure to produce a compound sintered body. Although there are no particular restrictions on the pressure applied, it is preferably, for example, 5 to 40 MPa. The reason for this is that, if the applied pressure is less than 5 MPa, a compound sintered body is unable to be obtained that has sufficient sintered body density. In addition, if the applied pressure exceeds 40 MPa, jigs composed of graphite and so forth end up being deformed and worn, thereby making this undesirable.

The temperature during sintering is preferably 1650 to 1850° C. If the sintering temperature is below 1650° C., a compound sintered body of adequate density cannot be obtained, while if the sintering temperature is above 1850° C., the sintered body is susceptible to decomposition and particle growth, thereby making this undesirable.

In addition, an argon atmosphere or nitrogen atmosphere is preferable for the atmosphere during sintering since this makes it possible to prevent oxidation of the silicon carbide.

Finally, through hole 1a or through holes 2a and 2b are formed by machining at the prescribed locations in the fabricated compound sintered body to produce first insulating member 1 and second insulating member 2.

In this step, when first insulating member 1 and second insulating member 2 are superimposed, through hole 1a is formed at the prescribed location of first insulating member 1 and through hole 2a is formed at the prescribed location of second insulating member 2 so that through holes 1a and 2a are positioned at the same location.

Next, an explanation is provided of the method for producing electrostatic chuck 10 from first insulating member 1 and second insulating member 2 produced in the manner described above.

By coating an electrically conductive material at the region at which electrode 3 is formed on the surface of second insulating material 2 produced in the manner described above, namely at the region within a prescribed radius from the center excluding the portions of through holes 2a and 2b, an electrically conductive material is ultimately formed that serves as electrode 3. In addition, by coating an insulating material at the region outside of the region at which the electrically conductive layer was formed on the surface of second insulating member 2, an insulating material layer is ultimately formed that serves as joining layer 4.

Examples of electrically conductive materials that are coated to form the electrically conductive layer include mixed powders of an electrically conductive ceramic powder such as tantalum carbide and titanium nitride, and an aluminum oxide-silicon dioxide-based glass powder.

In addition, examples of insulating materials that are coated to form the insulating material layer include various types of glass powders such as aluminum oxide-silicon dioxide glass.

Next, after superimposing first insulating member 1 and second insulating member 2 with the electrically conductive material layer and insulating material layer interposed between so that through holes 1a and 2a are at the same location, by heat treating while applying pressure, the electrically conductive material layer and insulating material layer temporarily melt and then solidify. At this time, in addition to electrode 3 being formed from the electrically conductive material layer, insulating joining layer 4 is formed from the insulating material layer, thereby causing first insulating member 1 and second insulating member 2 to be tightly joined with electrode 3 and insulating joining layer 4 interposed between.

Next, takeoff electrode 6, comprised of electrically conductive ceramics and so forth such as tantalum carbide or titanium nitride, is inserted into electrode insertion hole 2b of second insulating member 2, and the upper end of takeoff electrode 6 is electrically joined to electrode 3 by means of a soldering material such as active metal or silver solder.

Finally, a means for discharging the electrical charge of the fixed substrate, for example, a connecting wire, is connected to first insulating member 1 to produce electrostatic chuck 10.

According to the present mode for carrying out the invention, since a first insulating member 1 on the side on which a fixed substrate is placed is composed with a compound sintered body having satisfactory varistor characteristics, and since electrical charge that accumulates on the fixed substrate can be easily discharged by providing a connecting wire and so forth on first insulating member 1 even in cases in which the duration of plasma radiation onto electrostatic chuck 10 is long, there is no accumulation of electrical charge on the fixed substrate, thereby making it possible to provide an electrostatic chuck that is able to completely prevent abnormal discharge.

In addition, in the case of using the electrostatic chuck 10 of the present mode for carrying out the invention, since electrical charge that accumulates on the fixed substrate can be easily discharged by providing a connecting wire and so forth on the first insulating member 1, it is not necessary to install a ground wire, electrically conductive ring or ionizer and so forth on the fixed substrate as in the prior art, thereby making it possible to reduce production costs of the electrostatic chuck.

In addition, as a result of composing the first insulating member 1 and second insulating member 2 with a compound sintered body having the structure described above, the hardness and strength of the first insulating member 1 and second insulating member 2 can be increased, and the generation of particles from the first insulating member 1 and second insulating member 2 can be reduced, thereby making it possible to prevent contamination of the fixed substrate.

Moreover, as a result of composing the first insulating member 1 and second insulating member 2 with a compound sintered body having the structure described above, the first insulating member 1 and second insulating member 1 have low temperature dependency of their electrical conductivity, superior corrosion resistance to halogen gas, superior heat resistance and thermal shock resistance, and are free of the risk of being damaged by thermal stress even when used at high temperatures.

In addition, in the electrostatic chuck 10 of the present mode for carrying out the invention, by making the average particle size of the silicon carbide particles contained in the composite sintered body that composes first insulating member 1 and second insulating member 2 0.5 $\mu$m or less, and preferably 0.2 $\mu$m or less, and the average particle size of the silicon carbide particles 0.5 $\mu$m or less, and preferably 0.2 $\mu$m or less, the corrosion resistance to plasma of the first insulating member 1 and second insulating member 2 can be improved.

In addition, in the electrostatic chuck 10 of the present mode for carrying out the invention, it is preferable that the average particle size of the aluminum oxide particles contained in the compound sintered body that composes the first insulating member 1 be 2 $\mu$m or less. In the case the average particle size of the aluminum oxide particles exceeds 2 $\mu$m, the first insulating member 1 becomes susceptible to etching by plasma, sputtering scars are formed in the surface of first insulating member 1 on the side on which the fixed substrate is placed, surface roughness increases and the electrostatic adsorption force of the electrostatic chuck decreases. Therefore, by making the average particle size of the aluminum oxide particles 2 $\mu$m or less, high electrostatic adsorption force is able to be maintained even in cases in which first insulating member 1 is exposed to plasma.

In addition, in the present mode for carrying out the invention, it is preferable that at least a portion of the silicon carbide particles be present within the aluminum oxide particles in the compound sintered body that composes the first insulating member 1. In this case, in addition to being able to improve the plasma resistance of the first insulating member 1, due to the gap between the silicon carbide particles becoming narrower, varistor effects can be demonstrated by adding only a small amount of silicon carbide particles.

Furthermore, a small amount of impurities is allowed in the compound sintered body that composes the first insulating member 1 and second insulating member 2. Here, in the case of the fixed substrate being used for producing a semiconductor device, the decrease in life time and gate voltage in the semiconductor device production process are caused by transition metal elements and alkaline metals.

In addition, if the amount of metal impurities other than aluminum or silicon exceeds 0.1% by weight, together with the potential for contaminating the wafer or other fixed substrate increasing, the temperature dependency of the electrical resistance of the first insulating member also becomes larger, thereby making this undesirable.

Thus, in the electrostatic chuck 10 of the present mode for carrying out the invention, it is preferable that the content of metal impurities other than aluminum and silicon in the compound sintered body that composes first insulating member 1 and second insulating member 2 be 0.1% by weight or less.

The following provides an explanation of embodiments and comparative examples as claimed in the present invention.

Furthermore, in the following Embodiments 1 and 2 and Comparative Examples 1 and 2, only the composite ratios of silicon carbide and aluminum oxide that compose the first and second insulating members are changed, and electrostatic chucks are produced with the other conditions remaining the same.

The characteristics of the resulting electrostatic chucks were then evaluated.

Embodiment 1

Production of an Electoro Static Chuck and Evaluation of Compound Sintered Body Characteristics Ultra-fine silicon carbide powder having an average particle size of 0.05 $\mu$m was vapor phase synthesized by plasma CVD, and this ultra-fine silicon carbide powder was weighed out with aluminum oxide powder having an average particle size of 0.5 $\mu$m so that the content of silicon carbide powder was 5% by weight and the content of aluminum oxide powder was 95% by weight. These powders were then mixed for 2 hours using an ultra-high pressure crushing disperser.

After drying this mixed powder, it was formed into the shape of a disk. By sintering while applying pressure for 3 hours at a temperature of 1780° C. in an argon atmosphere, two disk-shaped compound sintered bodies were fabricated having a diameter of 195 mm and thickness of 4 mm. The pressure applied was set at 30 MPa.

Figure 4:
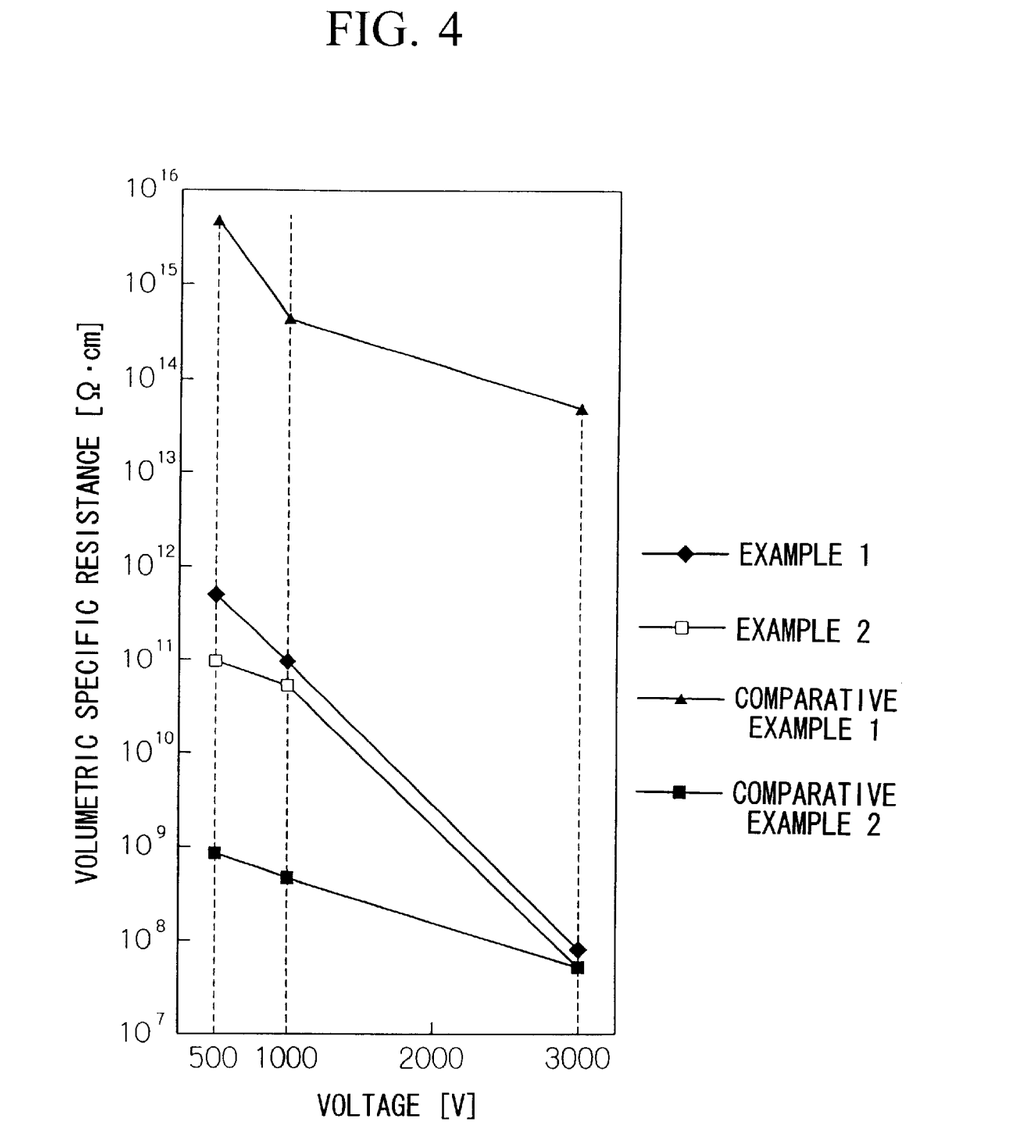
FIG. 4 is a graph showing the volumetric specific resistance values of respective compound sintered bodies of embodiments and comparative examples as claimed in the present invention.

The average particle sizes of the silicon carbide particles and aluminum oxide particles in the fabricated compound sintered bodies were measured by observing using a scanning electron microscope (SEM). In addition, the volumetric specific resistance, namely varistor characteristics, of the compound sintered bodies at load voltages of 500 V, 1000 V and 3000 V was measured in accordance with routine methods at a temperature of 20° C., which is the temperature at which the electrostatic chuck is used. Those results are shown in Table 1, Table 2 and FIG. 4.

As shown in Table 1, the average particle sizes of the silicon carbide particles and aluminum oxide particles in the fabricated compound sintered bodies were 0.2 $\mu$m and 1 $\mu$m, respectively. In addition, as shown in Table 2 and FIG. 4, in contrast to the volumetric specific resistance of the fabricated compound sintered bodies being $1\times10^{11}$ $\Omega\cdot$ cm or more when the load voltage was 1000 V or less, when the load voltage was 3000 V, the value was $8\times10^{7}$ $\Omega\cdot$ cm, thereby verifying that the fabricated compound sintered bodies demonstrate satisfactory varistor characteristics.

In addition, when the fabricated compound sintered bodies were observed with an SEM, a portion of the silicon carbide particles were observed to be present within the aluminum oxide particles.

Next, a through hole having an inner diameter of 15 mm was formed by machining in the center of the one of the two compound sintered body disks described above, and that disk was used as a first insulating member.

On the other hand, a through hole having an inner diameter of 15 mm was formed in the center of the other compound sintered body disk and an electrode insertion hole having an inner diameter of 10 mm was formed by machining at a location 25 mm away from the center, and this disk was used as a second insulating member.

Next, a mixed powder of tantalum carbide (30% by volume) and aluminum oxide (70% by volume) was coated onto the region that forms an electrode on the surface of the second insulating member, namely the region within a radius of 90 mm from the center, by screen printing to form an electrically conductive material layer.

In addition, aluminum oxide powder was coated onto the surface of the second insulating member at the region outside the region at which the electrically conducting material layer was formed, namely at a ring-shaped region having a radius of 90–97.5 mm, by screen printing to form an insulating material layer.

Next, the surface of the first insulating member on the side that joins with the second insulating member was ground by 1.3 mm, and after inserting a takeoff electrode made of tantalum carbide into the electrode insertion hole of the second insulating member, the first insulating member and second insulating member were superimposed with the electrically conductive material layer and insulating material layer in between. Next, by applying pressure of 7.5 MPa to the first insulating member and second insulating member while heating to 1700° C., together with forming an electrode from the electrically conducting material layer, a joining layer was formed from the insulating material layer, and the first and second insulating layers were joined with the electrode and joining layer interposed between.

Next, the surface of the electrostatic chuck (first insulating member) on the side on which the fixed substrate is placed was ground in accordance with routine methods, and the surface roughness Ra of the ground surface (center line average height) was made to be 20 Å and the surface roughness Rmax (maximum height) was made to be 100 Å.

Finally, a connecting wire for discharging electrical charge of the fixed substrate was connected to the first insulating member to complete the electrostatic chuck.

Measurement of Electrostatic Absorption Characteristics

The electrostatic adsorption force, adsorption time and release time of the electrostatic chuck produced in the manner described above were measured at a temperature of 20° C. (electrostatic adsorption characteristics test). A silicon wafer having a diameter of 20.32 cm (8 inches) was used for the fixed substrate. The results obtained at this time are shown in Table 3. Furthermore, in the present embodiment, Embodiment 2, Comparative Example 1 and Comparative Example 2 described below, the measuring apparatus used to measure electrostatic adsorption characteristics and the measurement method of electrostatic adsorption characteristics are described later.

Next, the electrostatic chuck was installed in a plasma CVD apparatus, and after radiating the electrostatic chuck with plasma for 20 hours in a mixed gas atmosphere (temperature: 50° C.) comprised of 20% by volume of $CF_4$ and 80% by volume of $O_2$ at $1.33\times10^2$ Pa (1.0 Torr), an electrostatic adsorption characteristics test was performed in the same manner as described above. The results obtained at this time are shown in Table 4.

The occurrence of abnormal discharge was not observed in the electrostatic chuck during plasma exposure.

In addition, there was no damage or destruction of the electrostatic chuck following plasma exposure.

The surface roughness Ra (center line average height) and surface roughness Rmax (maximum height) of the surface of the electrostatic chuck on the side on which the fixed substrate was placed following plasma exposure were measured in accordance with routine methods. Those results are shown in Table 4.

As shown in Tables 3 and 4, the electrostatic chuck produced in the present embodiment demonstrated high electrostatic adsorption force and short adsorption time and release time, thereby exhibiting satisfactory electrostatic adsorption characteristics both before and after plasma exposure.

In addition, as shown in Table 4, although surface roughness of the electrostatic chuck following plasma exposure on the side on which the fixed substrate is placed was slightly greater when compared with that before plasma exposure, the flatness of the electrostatic chuck surface was able to be maintained.

Furthermore, although the electrostatic chuck was heated to 400° C. at the rate of 80° C./minute in each of the electrostatic adsorption characteristics tests before and after plasma exposure, there was no damage or destruction of the electrostatic chuck due to thermal stress in either case.

Measurement Method of Electrostatic Adsorption Characteristics

The following provides a brief explanation of the general structure of the measuring apparatus and the measurement method of electrostatic adsorption characteristics used when measuring the electrostatic adsorption characteristics of the electrostatic chucks in the present embodiment and in Embodiment 2, Comparative Example 1 and Comparative Example 2 described below using as an example the case of measuring the electrostatic adsorption characteristics of electrostatic chuck 10 explained in the above mode for carrying out the invention based on FIG. 5.

Figure 5:
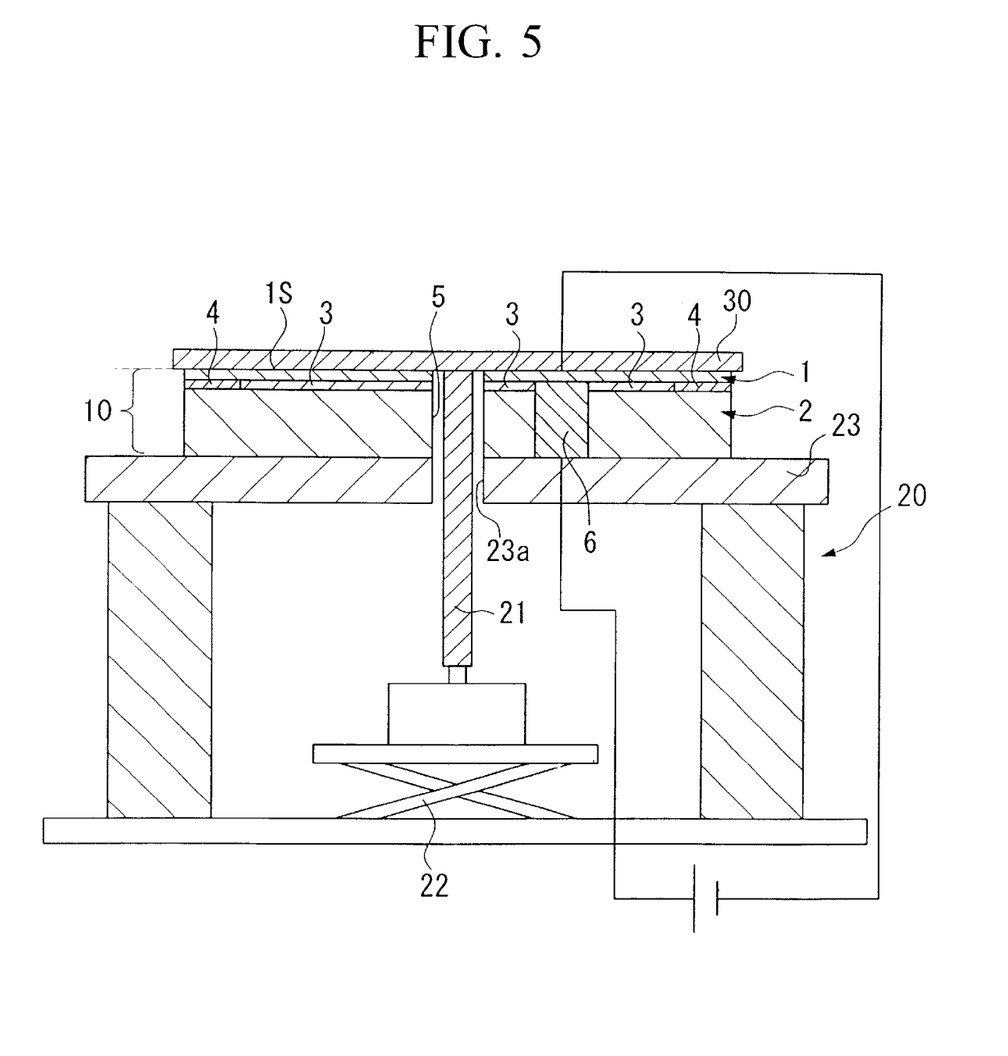
FIG. 5 is a schematic cross-sectional view showing a measuring apparatus for measuring the electrostatic adsorption characteristics of an electrostatic chuck.

FIG. 5 is a schematic cross-sectional view of electrostatic chuck 10 placed on measuring apparatus 20, and fixed substrate 30 placed on electrostatic chuck 10. Furthermore, an explanation of the structure of electrostatic chuck 10 is omitted since it was explained in the above mode for carrying out the invention.

As shown in FIG. 5, measuring apparatus 20 is composed primarily of electrostatic chuck stage 23 provided with through hole 23a, pressing member 21 inserted so as to freely pass through through hole 23a of electrostatic chuck stage 23, and lifter 22 for moving pressing member 21 in the vertical direction.

The following provides an explanation of the method for measuring electrostatic adsorption characteristics using measuring apparatus 20.

To begin with, electrostatic chuck 10 is placed on electrostatic chuck stage 23 so that the location of through hole 5 of electrostatic chuck 10 is at the same location as through hole 23a of electrostatic chuck stage 23.

Next, fixed substrate 30 is placed on electrostatic chuck 10 after inserting pressing member 21 through through hole 5 of electrostatic chuck 10 and through hole 23a of electrostatic chuck stage 23.

Next, lifter 22 is moved vertically and the upper end of pushing member 21 in the drawing makes contact with fixed substrate 30. While maintaining this state, a direct current voltage of 300 V is applied between surface 1S of the electrostatic chuck 10 on the side on which fixed substrate 30 is placed and takeoff electrode 6 at a temperature of 20° C., fixed substrate 30 is electrostatically adsorbed to electrostatic chuck 10, the application of voltage is terminated after 5 minutes have elapsed, and pushing member 21 is lifted up by moving lifter 22 in the vertical direction to release fixed substrate 30. The amount of force to release fixed substrate 30 at this time is measured with a load cell and taken to represent electrostatic adsorption force.

Here, the adsorption time was taken to be the amount of time until the electrostatic adsorption force of electrostatic chuck 10 reached $9.8 \times 10^4$ Pa (100 gf/cm$^2$) when a direct current voltage of 300 V was applied between surface 1S of electrostatic chuck 10 on the side on which fixed substrate 30 is placed and takeoff electrode 6.

In addition, release time was taken to be the amount of time until the electrostatic adsorption force of electrostatic chuck 10 reached $9.8 \times 10^3$ Pa (10 gf/cm$^2$) from the time the application of voltage was terminated after applying a direct current voltage of 300 V for 5 minutes between surface 1S of electrostatic chuck 10 on the side on which fixed substrate 30 is placed and takeoff electrode 6.

Embodiment 2

Compound sintered bodies were fabricated in the same manner as Embodiment 1. However, the composition of the compound sintered bodies consisted of 9% by weight of silicon carbide and 91% by weight of aluminum oxide. The average particle sizes of the silicon carbide particles and aluminum oxide particles in the fabricated compound sintered bodies, and each of the values of volumetric specific resistance at load voltages of 500 V, 1000 V and 3000 V of the compound sintered bodies (varistor characteristics) were measured in the same manner as Embodiment 1. The results that were obtained are shown in Table 1, Table 2 and FIG. 4.

As shown in Table 1, the average particle sizes of the silicon carbide particles and aluminum oxide particles in the fabricated compound sintered bodies were 0.2 μm and 1 μm, respectively. In addition, as shown in Table 2 and FIG. 4, in contrast to the volumetric specific resistance of the fabricated compound sintered bodies being $5 \times 10^{10}$ Ω·cm or more when the load voltage was 1000 V or less, when the load voltage was 3000 V, the value was $5 \times 10^7$ Ω·cm, thereby verifying that the fabricated compound sintered bodies demonstrate satisfactory varistor characteristics.

In addition, when the fabricated compound sintered bodies were observed with an SEM, a portion of the silicon carbide particles were observed to be present within the aluminum oxide particles.

An electrostatic chuck was produced under the same conditions as Embodiment 1 using this compound sintered body, and the respective electrostatic adsorption characteristics of the produced electrostatic chuck before and after plasma exposure were measured in a halogen gas atmosphere under the same conditions as Embodiment 1. The results that were obtained are shown in Tables 3 and 4.

The occurrence of abnormal discharge was not observed in the electrostatic chuck during plasma exposure, and there was no damage or destruction of the electrostatic chuck.

In addition, the surface roughness Ra (center line average height) and surface roughness Rmax (maximum height) of the surface of the electrostatic chuck on the side on which the fixed substrate was placed following plasma exposure were measured in accordance with routine methods. Those results are shown in Table 4.

As shown in Tables 3 and 4, the electrostatic chuck produced in the present embodiment demonstrated high electrostatic adsorption force and short adsorption time and release time, thereby exhibiting satisfactory electrostatic adsorption characteristics both before and after plasma exposure.

In addition, as shown in Table 4, although surface roughness of the electrostatic chuck following plasma exposure on the side on which the fixed substrate is placed was slightly greater when compared with that before plasma exposure, the flatness of the electrostatic chuck surface was able to be maintained.

Furthermore, although the electrostatic chuck was heated to 400° C. at the rate of 80° C./minute in each of the electrostatic adsorption characteristics tests before and after plasma exposure, there was no damage or destruction of the electrostatic chuck due to thermal stress in either case.

Comparative Example 1

Compound sintered bodies were fabricated in the same manner as Embodiment 1. However, the composition of the compound sintered bodies consisted of 3% by weight of silicon carbide and 97% by weight of aluminum oxide. The average particle sizes of the silicon carbide particles and aluminum oxide particles in the fabricated compound sintered bodies, and each of the values of volumetric specific resistance at load voltages of 500 V, 1000 V and 3000 V of the compound sintered bodies (varistor characteristics) were measured in the same manner as Embodiment 1. The results that were obtained are shown in Table 1, Table 2 and FIG. 4.

As shown in Table 1, the average particle sizes of the silicon carbide particles and aluminum oxide particles in the fabricated compound sintered bodies were 0.2 $\mu$m and 2 $\mu$m, respectively. In addition, as shown in Table 2 and FIG. 4, although the volumetric specific resistance of the fabricated compound sintered bodies decreased as the load voltage became higher, in comparison with the compound sintered bodies fabricated in Embodiments 1 and 2, the rate of decrease was smaller. As a result, the fabricated compound sintered bodies were demonstrated to not have satisfactory varistor effects.

In addition, when the fabricated compound sintered bodies were observed with an SEM, all of the silicon carbide particles were observed to be present outside the aluminum oxide particles.

An electrostatic chuck was produced under the same conditions as Embodiment 1 using this compound sintered body, and the respective electrostatic adsorption characteristics of the produced electrostatic chuck before and after plasma exposure were measured in a halogen gas atmosphere under the same conditions as Embodiment 1. The results that were obtained are shown in Tables 3 and 4.

The occurrence of abnormal discharge was observed in the electrostatic chuck during plasma exposure, and there was damage and destruction of the electrostatic chuck. In addition, the surface roughness Ra (center line average height) and surface roughness Rmax (maximum height) of the surface of the electrostatic chuck on the side on which the fixed substrate was placed following plasma exposure were measured in accordance with routine methods. Those results are shown in Table 4.

As shown in Tables 3 and 4, the electrostatic chuck produced in the present embodiment did not have adequate electrostatic adsorption force before and after plasma exposure, surface roughness of the electrostatic chuck on the side on which the fixed substrate is placed increased due to plasma exposure, and the flatness of the electrostatic chuck surface worsened considerably.

Comparative Example 2

Compound sintered bodies were fabricated in the same manner as Embodiment 1. The composition of the compound sintered bodies consisted of 15% by weight of silicon carbide and 85% by weight of aluminum oxide. The average particle sizes of the silicon carbide particles and aluminum oxide particles in the fabricated compound sintered bodies, and each of the values of volumetric specific resistance at load voltages of 500 V, 1000 V and 3000 V of the compound sintered bodies (varistor characteristics) were measured in the same manner as Embodiment 1. The results that were obtained are shown in Table 1, Table 2 and FIG. 4.

As shown in Table 1, the average particle sizes of the silicon carbide particles and aluminum oxide particles in the fabricated compound sintered bodies were 0.2 $\mu$m and 1 $\mu$m, respectively. In addition, as shown in Table 2 and FIG. 4, although the volumetric specific resistance of the fabricated compound sintered bodies decreased as the load voltage became higher, in comparison with the compound sintered bodies fabricated in Embodiments 1 and 2, the rate of decrease was smaller. As a result, the fabricated compound sintered bodies were demonstrated to not have satisfactory varistor effects.

In addition, when the fabricated compound sintered bodies were observed with an SEM, all of the silicon carbide particles were observed to be present outside the aluminum oxide particles.

An electrostatic chuck was produced under the same conditions as Embodiment 1 using this compound sintered body, and the respective electrostatic adsorption characteristics of the produced electrostatic chuck before and after plasma exposure were measured in a halogen gas atmosphere. The results that were obtained are shown in Tables 3 and 4.

The occurrence of abnormal discharge was observed in the electrostatic chuck during plasma exposure, and there was damage and destruction of the electrostatic chuck. In addition, the surface roughness Ra (center line average height) and surface roughness Rmax (maximum height) of the surface of the electrostatic chuck on the side on which the fixed substrate was placed following plasma exposure were measured in accordance with routine methods. Those results are shown in Table 4.

As shown in Tables 3 and 4, although the electrostatic chuck produced in the present embodiment had high electrostatic absorption force before plasma exposure, after plasma exposure, the surface roughness of the electrostatic chuck on the side on which the fixed substrate is placed increased, and electrostatic adsorption force decreased considerably.

TABLE 1

|  | Amount of silicon carbide added (% by wt) | Amount of aluminum oxide added (% by wt) | Avg. particle size of silicon carbide particles ($\mu$m) | Avg. particle size of aluminum oxide particles ($\mu$m) |
| --- | --- | --- | --- | --- |
| Embodiment 1 | 5 | 95 | 0.2 | 1 |
| Embodiment 2 | 9 | 91 | 0.2 | 1 |

TABLE 1-continued

|  | Amount of silicon carbide added (% by wt) | Amount of aluminum oxide added (% by wt) | Avg. particle size of silicon carbide particles (μm) | Avg. particle size of aluminum oxide particles (μm) |
|---|---|---|---|---|
| Comp. Ex. 1 | 3 | 97 | 0.2 | 2 |
| Comp. Ex. 2 | 15 | 85 | 0.2 | 1 |

TABLE 2

|  | Volumetric specific resistance (Ω · cm) | | |
|---|---|---|---|
|  | 500 V | 1000 V | 3000 V |
| Embodiment 1 | $5 \times 10^{11}$ | $1 \times 10^{11}$ | $8 \times 10^{7}$ |
| Embodiment 2 | $1 \times 10^{11}$ | $5 \times 10^{10}$ | $5 \times 10^{7}$ |
| Comp. Ex. 1 | $5 \times 10^{15}$ | $5 \times 10^{14}$ | $5 \times 10^{13}$ |
| Comp. Ex. 2 | $8 \times 10^{8}$ | $5 \times 10^{8}$ | $5 \times 10^{7}$ |

TABLE 3

Before Plasma Exposure

|  | Electrostatic adsorption characteristics | | | |
|---|---|---|---|---|
|  | Surface roughness | | Electrostatic adsorption force | Adsorption | Release |
|  | Ra (Å) | Rmax (Å) | (g/cm²) | time (sec) | time (sec) |
| Emb. 1 | 20 | 100 | 250 | 5 | 5 |
| Emb. 2 | 20 | 100 | 400 | 1 | 1 |
| Comp. Ex. 1 | 20 | 100 | 50 | 60 | 60 |
| Comp. Ex. 2 | 20 | 100 | 400 | 1 | 1 |

TABLE 4

After Plasma Exposure

|  | Electrostatic adsorption characteristics | | | |
|---|---|---|---|---|
|  | Surface roughness | | Electrostatic adsorption force | Adsorption | Release |
|  | Ra (Å) | Rmax (Å) | (g/cm²) | time (sec) | time (sec) |
| Emb. 1 | 30 | 270 | 230 | 5 | 5 |
| Emb. 2 | 50 | 270 | 370 | 1 | 1 |
| Comp. Ex. 1 | 370 | 2700 | 40 | 60 | 60 |
| Comp. Ex. 2 | 4000 | 20000 | 120 | 1 | 1 |

Embodiments 1 and 2, in which the contents of silicon carbide in the compound sintered bodies that compose the first insulating member and second insulating member were set to 5% by weight and 9% by weight within the range of 4–12% by weight, exhibited satisfactory electrostatic adsorption characteristics both before and after plasma exposure, and electrostatic chucks were obtained in which the first insulating member had satisfactory varistor characteristics, there was no occurrence of abnormal discharge observed in the plasma atmosphere, and there was no loss of a portion of the electrostatic chucks.

In contrast, in Comparative Example 1, in which the content of silicon carbide in the compound sintered body that composes the first insulating member and second insulating member was set to 3% by weight, the electrostatic chuck that was produced did not have adequate electrostatic adsorption force before plasma exposure, the surface roughness of the electrostatic chuck on the side on which the fixed substrate is placed increased, the occurrence of abnormal discharge was observed during plasma exposure, and the electrostatic was damaged and destroyed.

In addition, in Comparative Example 2, in which the content of silicon carbide in the compound sintered body that composes the first insulating member and second insulating member was set to 15% by weight, although the electrostatic chuck that was produced had high electrostatic adsorption force before plasma exposure, after plasma exposure, surface roughness of the electrostatic chuck on the side on which the fixed substrate is placed increased, electrostatic adsorption force decreased remarkably, the occurrence of abnormal discharge was observed in the plasma atmosphere, and a portion of the electrostatic chuck was lost.

Furthermore, in the above Embodiments 1 and 2, although the explanation related only to the case of the contents of silicon carbide in the compound sintered bodies that compose the first insulating member and second insulating member being 5% by weight and 9% by weight, it was confirmed by the inventor of the present invention that an electrostatic chuck can be produced that has equivalent effects provided the content of silicon carbide is within the range of 4–12% by weight.

What is claimed is:

1. An electrostatic chuck provided with a pair of insulating members disposed in mutual opposition between which an electrode is interposed; wherein, a first insulating member of the pair of insulating members at least on the side on which a fixed substrate is placed is composed of a compound sintered body having for its main components 4% by weight to 12% by weight of silicon carbide particles and aluminum particles, and the first insulating member has varistor characteristics.

2. The electrostatic chuck according to claim 1 wherein, the varistor characteristics are such that the volumetric specific resistance value of the first insulating member is from $1 \times 10^{9}$ to $1 \times 10^{12}$ Ω· cm when the potential difference between the surface of the first insulating member on which the fixed substrate is placed and the electrode is 1000 V or less, and from $1 \times 10^{7}$ to $1 \times 10^{8}$ Ω· cm when the potential difference between the surface of the first insulating member on the side on which the fixed substrate is placed and the electrode is 3000 V or more.

3. The electrostatic chuck according to claim 1 wherein, the average particle size of the silicon carbide particles contained in the compound sintered body that composes the first insulating member is 0.5 μm or less.

4. The electrostatic chuck according to claim 1 wherein, the average particle size of the silicon carbide particles contained in the compound sintered body that composes at least the first insulating member is 0.2 μm or less.

5. The electrostatic chuck according to claim 1 wherein, the average particle size of the aluminum oxide particles contained in the compound sintered body that composes at least the first insulating member is 2 μm or less.

6. The electrostatic chuck according to claim 1 wherein, at least a portion of the silicon carbide particles are present within the aluminum oxide particles.

7. The electrostatic chuck according to claim 1 wherein, the content of metal impurities other than aluminum and silicon in the compound sintered body that composes at least the first insulating member is preferably 0.1% by weight or less.

8. The electrostatic chuck according to claim 1 wherein, a joining layer composed of an insulating material is formed around the electrode, and the pair of insulating members are joined by this joining layer.

9. The electrostatic chuck according to claim 1 wherein, the electrode contains as its main component electrically conductive ceramics.

* * * * *